United States Patent [19]

Kato et al.

[11] Patent Number: 5,148,259

[45] Date of Patent: Sep. 15, 1992

[54] SEMICONDUCTOR DEVICE HAVING THIN FILM WIRING LAYER OF ALUMINUM CONTAINING CARBON

[75] Inventors: Takashi Kato, Sagamihara; Takashi Ito, Kawasaki; Mamoru Maeda, Tama, all of Japan

[73] Assignee: Fujitsu Limited, Kawasaki, Japan

[21] Appl. No.: 740,872

[22] Filed: Jul. 31, 1991

Related U.S. Application Data

[63] Continuation of Ser. No. 86,623, Aug. 18, 1987, abandoned.

[30] Foreign Application Priority Data

Aug. 19, 1986 [JP] Japan .............................. 61-193445
Aug. 19, 1986 [JP] Japan .............................. 61-193446
Aug. 19, 1986 [JP] Japan .............................. 61-193447

[51] Int. Cl.$^5$ ............................................ H01L 23/48
[52] U.S. Cl. ......................................... 357/67; 357/60; 357/71; 437/194; 437/197; 437/957
[58] Field of Search .................... 357/71, 67, 60; 420/548, 550; 428/651, 548; 437/197, 194, 195, 957; 148/DIG. 140; 204/192.15, 192.17

[56] References Cited

U.S. PATENT DOCUMENTS

| | | | |
|---|---|---|---|
| 1,718,685 | 6/1929 | De Vries et al. | 420/550 |
| 4,673,623 | 6/1987 | Gardner et al. | 428/651 |
| 4,720,434 | 1/1988 | Kubo et al. | 420/548 |
| 4,899,206 | 2/1990 | Sakurai et al. | 357/71 |
| 4,942,451 | 7/1990 | Tamaki et al. | 357/67 |
| 4,990,997 | 2/1991 | Nishida | 357/71 |
| 5,018,001 | 5/1991 | Kondo et al. | 357/71 |
| 5,019,891 | 5/1991 | Onuki et al. | 357/71 |
| 5,040,048 | 8/1991 | Yasue | 357/67 |
| 5,051,812 | 9/1991 | Onuki et al. | 357/67 |

FOREIGN PATENT DOCUMENTS

| | | | |
|---|---|---|---|
| 0253299 | 1/1988 | European Pat. Off. | 357/71 |
| 0657075 | 4/1979 | Japan | 420/548 |
| 58-182821 | 10/1983 | Japan | 357/71 |
| 0165366 | 8/1985 | Japan | 428/651 |
| 0216445 | 9/1986 | Japan | 437/197 |
| 0284948 | 12/1986 | Japan | 357/70 |
| 63-115372 | 5/1988 | Japan | 357/71 |
| 1-45163 | 2/1989 | Japan | 357/71 |
| 1-64255 | 3/1989 | Japan | 357/71 |
| 0764818 | 1/1957 | United Kingdom | 420/548 |

*Primary Examiner*—Rolf Hille
*Assistant Examiner*—Minhloan Tran
*Attorney, Agent, or Firm*—Staas & Halsey

[57] ABSTRACT

A semiconductor device comprises one or a plurality of thin film wiring layers made of aluminum containing carbon, so as to obtain hillock-free wiring layers. A method of forming the thin film wiring layer employs a plasma-enhanced chemical vapor deposition or a magnetron-plasma chemical vapor deposition to form the thin film wiring layer.

11 Claims, 13 Drawing Sheets

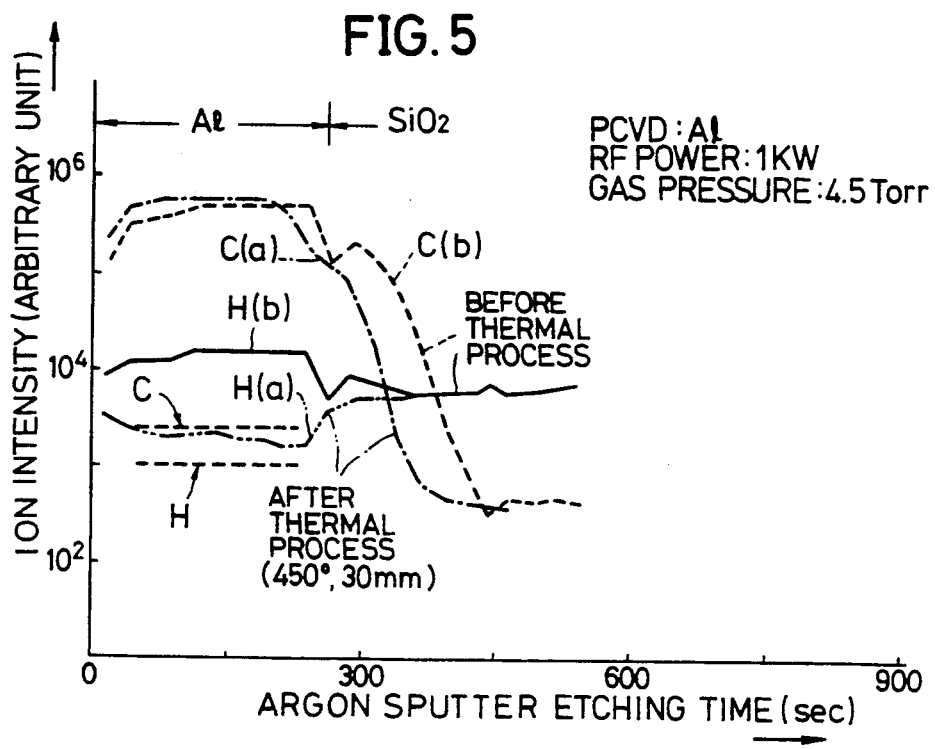
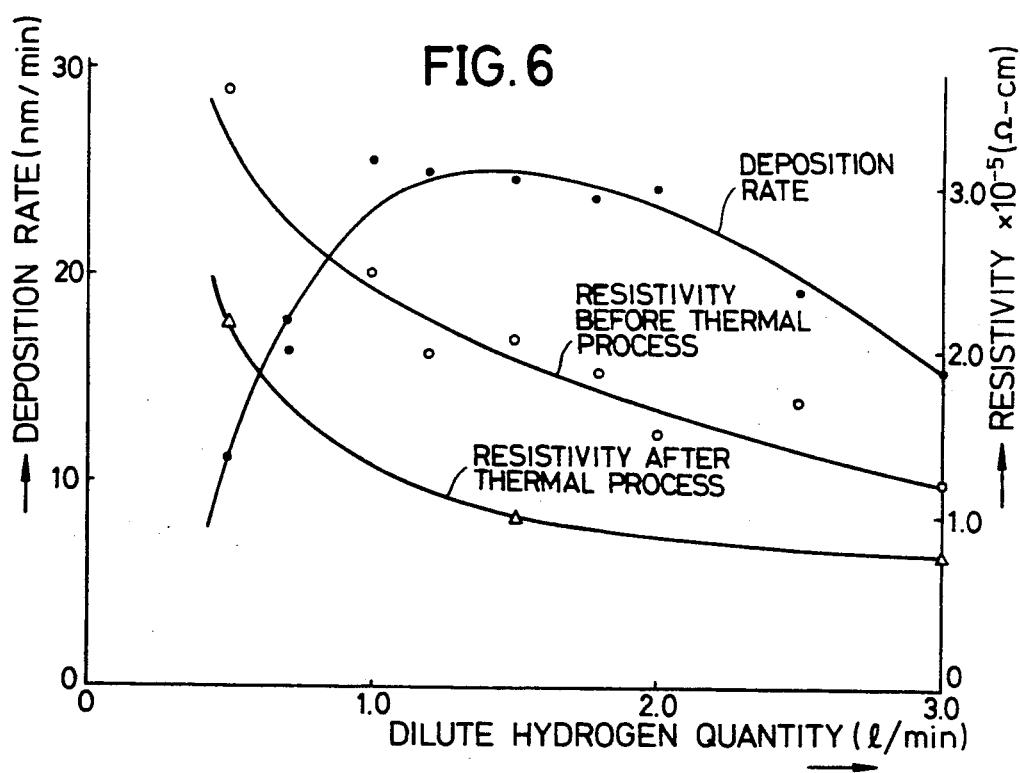

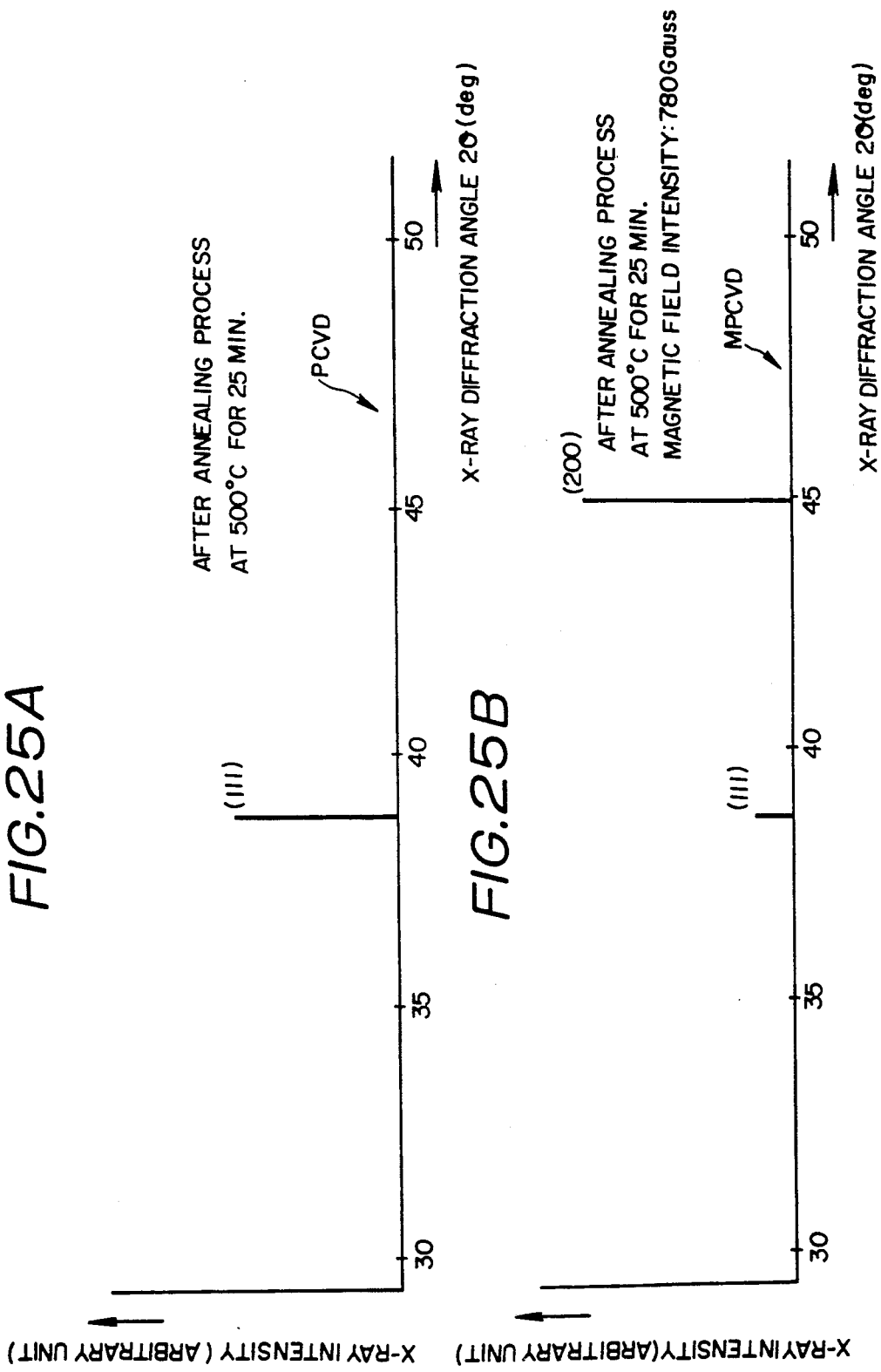

1

SEMICONDUCTOR DEVICE HAVING THIN FILM WIRING LAYER OF ALUMINUM CONTAINING CARBON

This application is a continuation of application Ser. No. 07/086,623 filed Aug. 18, 1987, now abandoned.

BACKGROUND OF THE INVENTION

The present invention generally relates to semiconductor devices having thin film wiring layers and methods of forming thin film wiring layers, and more particularly to a semiconductor device having a thin film wiring layer made of aluminum containing carbon and a method of forming a thin film wiring layer made of aluminum containing carbon.

An integrated circuit is produced by forming elements on a semiconductor substrate and connecting the elements by a metal thin film wiring layer. The size of the elements and the wiring layer is reduced so as to increase the integration density of the integrated circuit, but presently, the integration density of the integrated circuit is limited by the limit in reducing the size of the wiring layer.

When the film thickness of the wiring layer is made extremely small, a disconnection of the wiring layer easily occurs at a stepped portion of the wiring layer. Furthermore, aluminum is normally used for the wiring layer, but the electromigration in the aluminum wiring layer increases with increasing current density and a void is easily generated in a portion of the aluminum wiring layer where the aluminum atoms lack. A disconnection occurs at such a portion of the aluminum wiring layer where the void is generated. On the other hand, a hillock is generated at a portion of the aluminum wiring layer where there are excessive the aluminum atoms, and the hillock easily causes a short-circuit between layers on the semiconductor substrate In addition, when the aluminum wiring layer is formed on a doped region of a silicon layer, for example, the aluminum easily diffuses into the doped region in the spike and short-circuits a junction between the silicon layer and the doped region.

The above described problems of the aluminum wiring layer are all caused by the fact that migrations easily occur in the case of aluminum atoms. The migration includes the electromigration and stress migration. While the electromigration is dependent on the current density, the stress migration is independent of the current density. A stress acts on the aluminum wiring layer from one or more layers in contact with the aluminum wiring layer, and the aluminum atoms are easily moved by this stress at high temperatures. Hence, when the aluminum wiring layer is cooled after being heated, a disconnection easily occurs in the aluminum wiring layer due to the stress. When a semiconductor device is produced, the semiconductor device is usually subjected to processes at high temperatures, and it is thus extremely difficult to suppress the stress migration in the aluminum wiring layer.

Accordingly, attempts have been made to eliminate the above described problems by using an aluminum alloy for the wiring layer, such as aluminum containing copper and aluminum containing silicon. However, when the aluminum containing copper is used as the wiring layer and this wiring layer is etched by a reactive ion etching (RIE) using chlorine gases, it has been found that copper residue remains at the surface of the wiring layer after the RIE and there is a problem in that it is difficult to remove this copper residue.

On the other hand, problems also occur when the aluminum containing silicon is used for the wiring layer, although silicon is prevented from diffusing into the wiring layer when the wiring layer made of the aluminum containing silicon is formed on a silicon layer. For example, when a silicon layer has an $n^+$-type doped region and the wiring layer also covers a contact hole located above and exposing the $n^+$-type doped region, a solid phase epitaxial growth of the silicon contained in the wiring layer occurs on the $n^+$-type doped region especially in a vicinity of the wall of the contact hole. But since this epitaxially grown silicon is of the p-type, a p-n junction is formed at the contact portion between the $n^+$-type doped region and the wiring layer thereon and increases the resistance and the contact portion.

In order to reduce the hillock which is generated in the aluminum wiring layer, there is a conventional semiconductor device having a plurality of aluminum wiring layers, with a metal layer interposed between two adjacent aluminum wiring layers. However, it is impossible to completely eliminate the hillock in the aluminum wiring layer, and the problems described before occur due to the generation of the hillock.

Therefore, there are demands for a wiring layer which can effectively contribute to the further increase in the integration density of the integrated circuit, and a method of forming such a wiring layer.

SUMMARY OF THE INVENTION

Accordingly, it is a general object of the present invention to provide a novel and useful semiconductor device having a thin film wiring layer made of aluminum containing carbon and a method of forming a thin film wiring layer made of aluminum containing carbon.

Another and more specific object of the present invention is to provide a semiconductor device having a thin film wiring layer which is made of aluminum containing carbon. According to the semiconductor device of the present invention, it is possible to effectively prevent the generation of hillock and also suppress the generation of electromigration and stress migration in the wiring layer which has an extremely small film thickness.

Still another object of the present invention is to provide a semiconductor device having a plurality of thin film wiring layers which are made of aluminum containing carbon, and a metal layer formed on top and bottom of each wiring layer. According to the semiconductor device of the present invention, it is possible to reduce the resistivity of the wiring layer caused by the carbon contained in the wiring layer.

A further object of the present invention is to provide a method of forming a thin film wiring layer, in which a plasma-enhanced chemical vapor deposition (CVD) is used to form the wiring layer which is made of aluminum containing carbon. According to the method of the present invention, it is possible to effectively prevent the generation of hillock and also suppress the generation of electromigration and stress migration in the wiring layer which has an extremely small film thickness.

Another object of the present invention is to provide a method of forming a thin film wiring layer, in which a magnetron-plasma CVD is used to form the wiring layer which is made of aluminum containing carbon. According to the method of the present invention, it is possible to stably control the film thickness of the wiring layer.

Other objects and further features of the present invention will be apparent from the following detailed description when read in conjunction with the accompanying drawings.

BRIEF DESCRIPTION OF THE DRAWINGS

FIG. 5 shows an argon sputter etching time versus ion intensity characteristic;

FIG. 6 shows dilute hydrogen quantity versus deposition rate and resistivity characteristics;

FIGS. 25A and 25B show X-ray diffraction angle versus X-ray intensity characteristics of aluminum films containing carbon formed by the plasma-enhanced CVD and the MPCVD, respectively, after an annealing process is carried out.

DESCRIPTION OF THE PREFERRED EMBODIMENT

Figure 1:
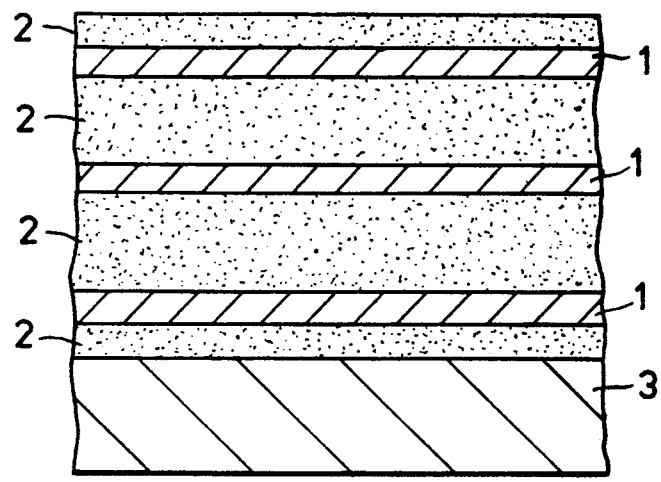
FIG. 1 is a cross sectional view showing an essential part of a conventional semiconductor device having a plurality of aluminum wiring layers.

FIG. 1 shows an example of the conventional semiconductor device having a plurality of aluminum wiring layers. In FIG. 1, a plurality of aluminum wiring layers 1 are formed on a silicon dioxide ($SiO_2$) oxide layer 3, with a metal layer 2 formed above and below each aluminum wiring layer 1. The generation of hillock is reduced to a certain extent compared to the case where only a single aluminum wiring layer is formed, however, it is impossible to completely eliminate the hillock in the aluminum wiring layers 1, and the problems described before occur due to the generation of the hillock.

The present invention eliminates the problems of the conventional semiconductor device by forming a wiring layer made of aluminum containing carbon.

Figure 2:
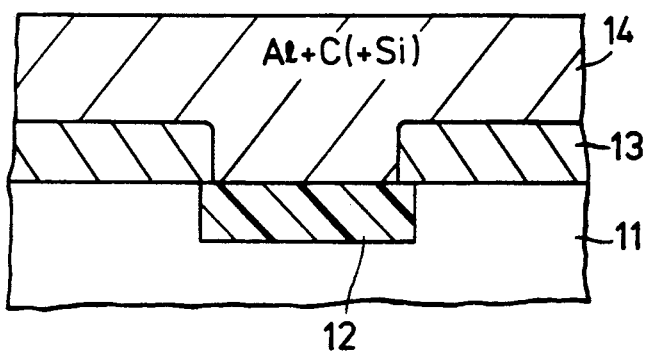
FIG. 2 is a cross sectional view showing an essential part of a first embodiment of the semiconductor device having a thin film wiring layer according to the present invention.

FIG. 2 shows an essential part of a first embodiment of the semiconductor device having a thin film wiring layer according to the present invention. In FIG. 2, a semiconductor device comprises a silicon substrate 11, a diffusion layer 12, an $SiO_2$ oxide layer 13, and a wiring layer 14. The wiring layer 14 constitutes an essential part of the present invention, and this wiring layer is an aluminum film containing carbon.

A description will now be given on the method of mixing carbon to aluminum. When an aluminum film is doped with carbon by an ion implantation, the resistivity of the aluminum film gradually increases when 0.1 atomic percent or more of carbon is implanted into the aluminum film, but the carbon precipitates out of the aluminum film under a thermal process of 450° C. It may be regarded that the carbon precipitates out of the aluminum film because there is no chemical bonding between the carbon and aluminum, and the carbon precipitates out of the aluminum film by the thermal process over a solubility limit of 0.1 atomic percent of carbon.

Hence, when the carbon is introduced into the aluminum film so that there is chemical bonding between the carbon and aluminum, the precipitation of carbon does not occur even after the thermal process. In this case, however, the aluminum film containing the carbon can no longer be used as a wiring layer when the atomic percent of carbon exceeds a predetermined value, because the resistivity increases exponentially when the atomic percent of carbon exceeds the predetermined value.

Figure 3:
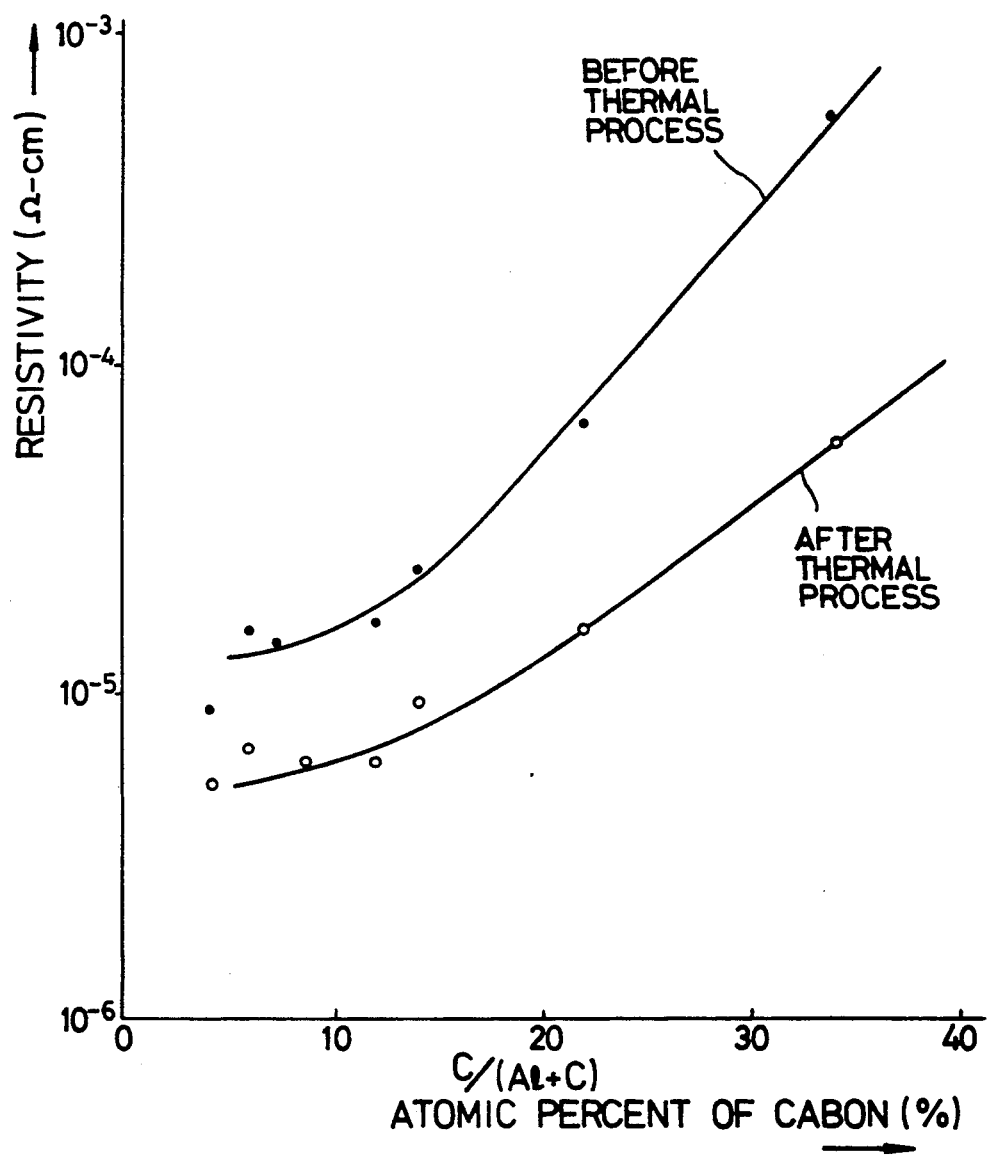
FIG. 3 shows an atomic percent of carbon versus resistivity characteristic for explaining a first embodiment of the method of forming the thin film wiring layer according to the present invention.

FIG. 3 shows the atomic percent of carbon versus resistivity characteristic before and after the thermal process, where the atomic percent of carbon (C/(Al+C)) is varied. As may be seen from FIG. 3, there is virtually no increase in the resistivity for atomic percent of carbon of 20% or less. It is also seen that the resistivity becomes approximately one-half after the thermal process at 450° C. for atomic percent of carbon of 20% or less. For example, the predetermined value of the atomic percent of carbon is 30% in FIG. 3.

As a result of X-ray measurements, the aluminum film containing carbon has fine oriented crystal structure, and it may be regarded that the carbon enters into the grain boundary The grain size of the aluminum film formed by a plasma-enhanced CVD before being subjected to the thermal process is in the order of 20 nm. For this reason, it is possible to suppress the migration of the aluminum atoms even during the thermal process, and the crystal growth does not occur rapidly. The grain size of the aluminum film containing carbon is in the order of 50 nm even after being subjected to a thermal process at 600° C. for 30 minutes. In addition, the electromigration caused by the increase in the current density is also suppressed, and there is no generation of hillocks. When the effects of electromigration are observed in mean time to failure (MTF), it is found that the serviceable life of the aluminum film containing carbon is longer by approximately one digit (unit) when compared with that of the conventional aluminum film. The activation energy level of the MTF is 0.65 eV for the pure aluminum film, while the activation energy level of the MTF for the aluminum film containing carbon formed by a magnetron plasma CVD which will be described later is 0.73 eV, and the reliability of the aluminum film containing carbon is improved compared to the conventional aluminum film. The hillock is generated after a thermal process at 400° C. in the case of the conventional aluminum film containing no carbon, but the aluminum film containing carbon has superior characteristics compared to those of the conventional aluminum film in that the hillock is not generated even after the thermal process at 600° C.

The chemical bonding between the carbon and aluminum atoms were measured by an X-ray optoelectronic analyzer, and the complete chemical bonding between the carbon and aluminum atoms was confirmed. In the present invention, the aluminum film having the fine crystal structure contains therein the carbon in a state where the carbon atoms are chemically bonded to the aluminum atoms. Accordingly, the fact that the grain size of the aluminum film containing carbon is 100 nm or less is extremely important in realizing an extre fine wiring layer, especially because the width of the wiring layer is recently becoming 1 μm or less.

Contacts must be formed when electrically connecting elements formed on a silicon substrate, but the conventional devices suffer problems in that the silicon easily diffuses into the aluminum film from the silicon substrate However, in the present invention, it is possible to prevent the silicon from diffusing into the aluminum film containing carbon by adding silicon to the aluminum film containing carbon. Furthermore, the migration of the silicon atoms is also restricted by the aluminum film containing carbon and silicon, and there is very little solid phase epitaxial growth of silicon at the contact portion As a result, the contact resistance is extremely small. In this case, it is necessary to limit the atomic percent of silicon under a solubility limit of 2% since the silicon will precipitate out of the aluminum film containing the carbon when this solubility limit is exceeded.

Next, a description will be given on the plasma-enhanced CVD (hereinafter simply referred to as a plasma CVD) which is employed in forming the aluminum film containing carbon. Generally, when the aluminum film is formed by the thermal CVD which subjects the source gas to pyrolysis, substantial surface irregularities are generated on the aluminum film. Even in the case of the plasma CVD which is employed in the present invention, the surface irregularities are generated on the aluminum film when the aluminum film is formed at a temperature over a temperature at which the pyrolysis occurs. It may be regarded that the surface irregularities are generated due to the large cohesion of aluminum, and this phenomenon is inevitable in the thermal CVD.

Accordingly, in the present invention, the plasma CVD is employed to excite the organic metal gas and the like so as to enhance the chemical bonding, and the aluminum film is formed at a temperature under the pyrolysis temperature, that is, at such a temperature that the cohesion of aluminum does not occur. The plasma CVD is advantageous in that the chemical bonding between the carbon and aluminum becomes complete by the use of the plasma.

Figure 4:
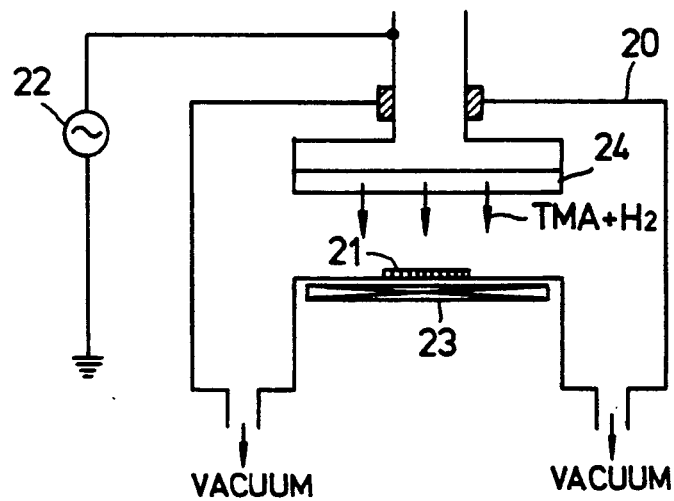
FIG. 4 generally shows a plasma-enhanced chemical vapor deposition (CVD) system used in the first embodiment of the method.

FIG. 4 generally shows a plasma CVD system used in the first embodiment of the method of forming the thin film wiring layer according to the present invention. As shown in FIG. 4, a silicon (Si) wafer 21 is placed within a parallel plate type plasma chamber 20. An RF generator 22 generates a signal of 13.56 MHz, and a heater 23 is provided outside the chamber 20 at a position below the Si wafer 21. An organic metal gas such as trimethyl aluminum (Al(CH$_3$)$_3$, TMA) gas is diluted by hydrogen gas and introduced into the chamber 20 through shower nozzles 24 of the upper electrode. In this case, the TMA gas is cooled to a temperature below the fusing point of 15° C., that is, to 5° C., for example.

The argon sputter etching time versus ion intensity characteristic is shown in FIG. 5. The deposition is carried out under an RF power of 1 kW, a gas pressure of 4.5 Torr, and a thermal process temperature of 450° C. for 30 minutes It can be seen from the analyzed results shown in FIG. 5 that before the thermal process, hydrogen is observed in the film as indicated by a solid line H(b) in addition to carbon indicated by a phantom line C(b). But after the thermal process at 450° C, the hydrogen decreases as indicated by a two-dot chain line H(a), while the carbon is indicated by a one-dot chain line C(a). It may be regarded that the decrease in the hydrogen is caused by the thermal process which eliminates CH$_3$ base which is not decomposed and is included in the film before the thermal process. For this reason, it is necessary to carry out a thermal process after the deposition of the film. In FIG. 5, the ordinate indicates the intensity in arbitrary units, and a range indicated by a phantom line in the vicinity of the unit 10$^3$ corresponds to the measuring limit.

The atomic percent of carbon contained in the aluminum film can be controlled by varying the RF power and the dilute hydrogen quantity FIG. 6 shows the dilute hydrogen quantity versus deposition rate and resistivity characteristics. It is seen from FIG. 6 that the resistivity is high and the deposition rate is small when the dilute hydrogen quantity is not over a predetermined value. In other words, the dilute hydrogen quantity must be over approximately 60 times that of the carrier gas (or source gas). The carrier gas may be other than the organic metal gas (TMA gas), such as a gas mixture of organic metal gas and silane (SiH$_4$) gas.

It is possible to apply a magnetic field during the plasma CVD and carry out a magnetron-plasma CVD so as to magnetically enhance the plasma reaction and accordingly form a film having an extremely small resistivity. A detailed description on the magnetron-plasma CVD will be given later on in the present specification in conjunction with a second embodiment of the method according to the present invention. The following Table compares the gas pressure, film thickness, resistivity and atomic percent of carbon of the films formed by the plasma CVD (PCVD) and the magnetron-plasma CVD (MPCVD), where the values in brackets indicate values obtained after a thermal process at 450° C. for 25 minutes.

TABLE

|  | Deposition Method | | | |
|---|---|---|---|---|
|  | PCVD | | MPCVD | |
|  | Pressure (Torr) | | | |
|  | 2.3 | 4.0 | 2.3 | 4.0 |
| Film thickness (nm) | 100 | 135 | 120 | 110 |
|  | (75) | (120) | (120) | (105) |
| Resistivity (Ω-cm) | 63 | 23 | 15 | 9.0 |
|  | (15) | (9.2) | (6.8) | (5.2) |
| Atomic percent of carbon (%) | 22 | 14 | 5.7 | 4.1 |
|  | (22) |  | (5.2) |  |

Figure 7:
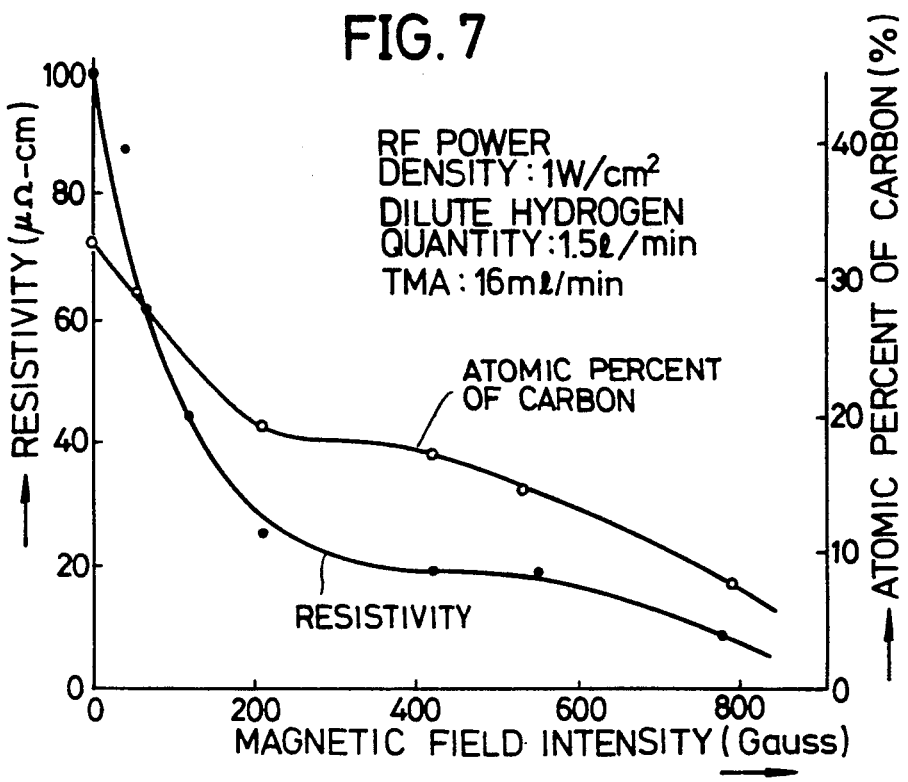
FIG. 7 shows magnetic field intensity versus resistivity and atomic percent of carbon characteristics.

As may be seen from the Table, it is desirable that the gas pressure is high within such a range that the generation of plasma is stable, and the resistivity becomes smaller as the magnetic field intensity increases as shown in FIG. 7. As may be seen from FIG. 7, the atomic percent of carbon and the resistivity can be made small by controlling the magnetic field intensity, and the atomic percent of carbon and the resistivity can be made small especially for the magnetic field intensity of 200 Gauss or more.

Figure 8:
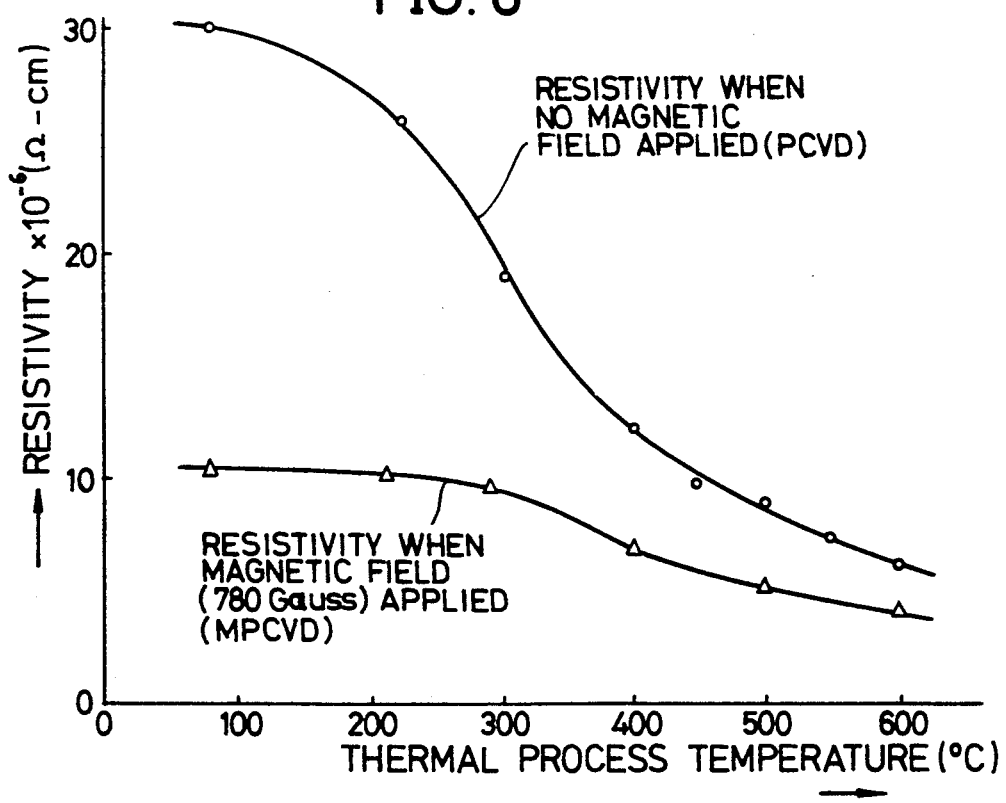
FIG. 8 shows a thermal process temperature versus resistivity characteristic.

FIG. 8 shows a thermal process temperature versus resistivity characteristic. As may be seen from FIG. 8, the thermal process at 300° C. or higher and the magnetron-plasma CVD with a magnetic field intensity of 780 Gauss are effectively in reducing the resistivity.

Figure 9:
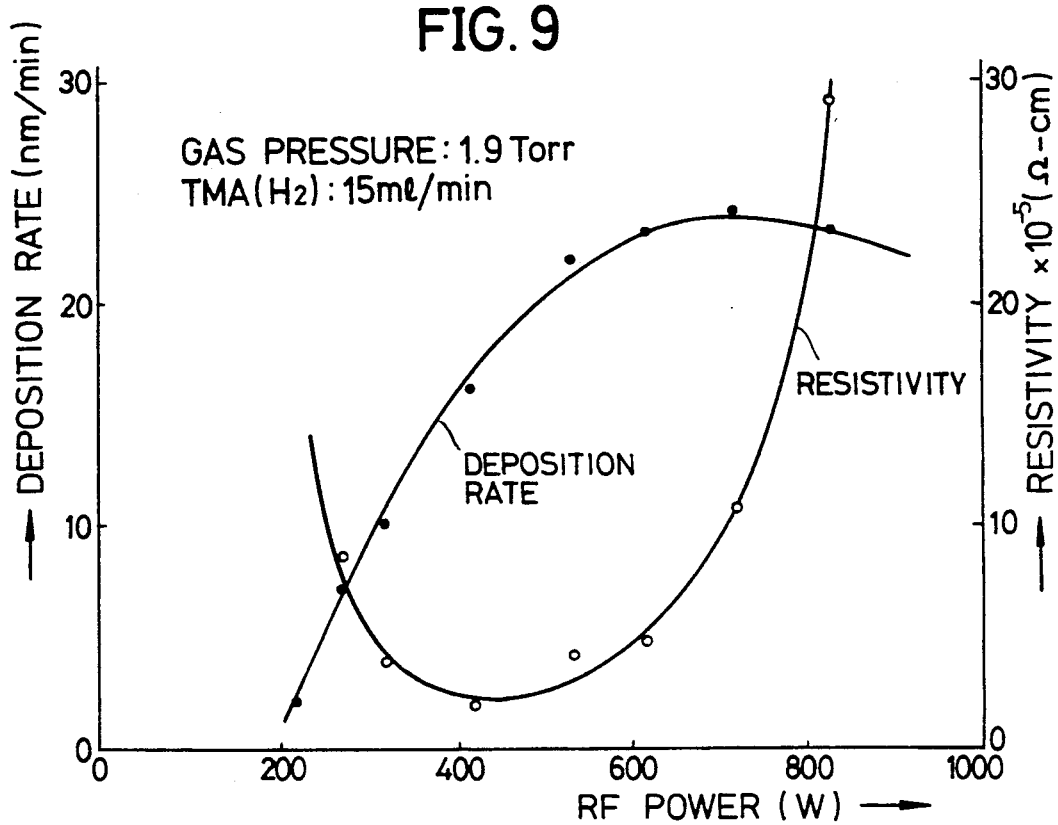
FIG. 9 shows RF power versus deposition rate and resistivity characteristics.

FIG. 9 shows RF power versus deposition rate and resistivity characteristics. The deposition rate increases with the increase in the RF power, but the resistivity undergoes a peculiar variation. In other words, when the deposition takes place at a low RF power, there is a problem in that the deposition rate becomes slow and the relative intake of oxygen increases to increase the resistivity. On the other hand, when the RF power is excessively high, it is inconvenient in that a polymer is formed (that is, the atomic percent of carbon is too large). Accordingly, it is desirable that the RF power is in a range of 300 W to 800 W.

Figure 10A:
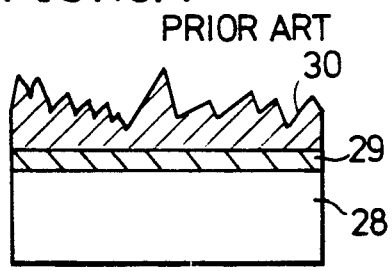
FIGS. 10A and 10B are cross sectional views showing films formed by the conventional methods.
Figure 10B:
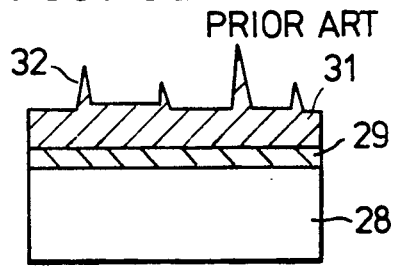

FIGS. 10A and 10B are cross sectional views showing films formed by the conventional method employing the thermal CVD and the conventional method employing vapor deposition or sputtering, respectively. When an aluminum film 30 is formed on a SiO₂ oxide layer 29 which is provided on top of a Si layer (or substrate) 28 by the thermal CVD, there are substantial surface irregularities on the aluminum film 30 as shown in FIG. 10A. When an aluminum film 31 is formed on the SiO₂ oxide layer 29 by a vapor deposition or sputtering and thereafter subjected to a thermal process at 450° C., a hillock 32 is generated on the aluminum film 31 as shown in FIG. 10B.

Figure 10C:
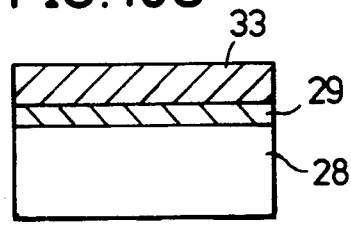
FIG. 10C is a cross sectional view showing a film formed by the method of the present invention employing the plasma-enhanced CVD.

On the other hand, FIG. 10C is a cross sectional view showing a film formed by the first embodiment of the method of the present invention employing the plasma CVD. When an aluminum film 33 containing carbon is formed on the SiO₂ oxide layer 29 by the plasma CVD and preferably by the magnetron-plasma CVD with a magnetic field intensity of 780 Gauss, no hillock is generated on the aluminum film 33 containing carbon, and it is seen that the film 33 is less affected by the migration of the aluminum atoms.

Figure 11:
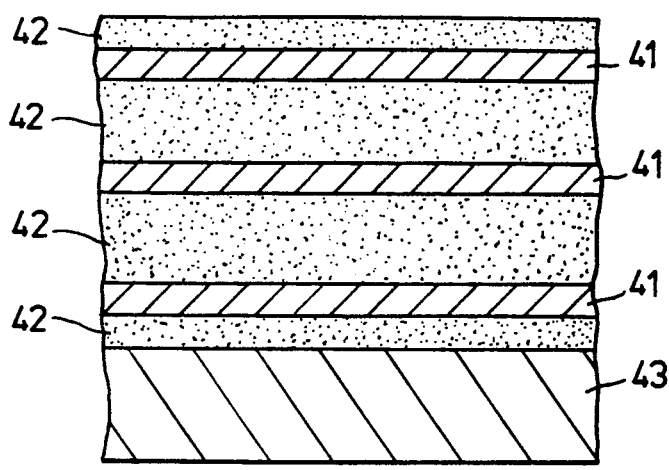
FIG. 11 is a cross sectional view showing an essential part of a second embodiment of the semiconductor device having thin film wiring layers according to the present invention.

FIG. 11 shows an essential part of a second embodiment of the semiconductor device having thin film wiring layers according to the present invention. In FIG. 11, a plurality of wiring layers 41 made of aluminum containing carbon are formed on a silicon dioxide (SiO₂) oxide layer 43, with a metal layer 42 formed on top and bottom of each wiring layer 41. For example, the atomic percent of carbon contained in the wiring layers 41 is set in a range of 10% to 30%. The metal layer 42 may be made of aluminum containing a small atomic percent of carbon in the order of 0.1% or less, or other metals such as titanium (Ti) and tungsten (W). According to the present embodiment, it is possible to further reduce the resistivity of the wiring layers 41 as a whole and also reduce undesirable effects of stress on the wiring layers 41, in addition to the effects obtainable in the first embodiment described before.

Figure 12:
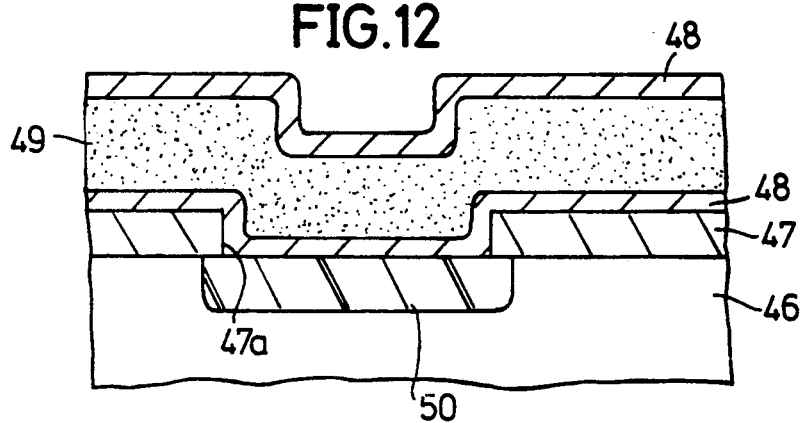
FIG. 12 is a cross sectional view showing a third embodiment of the semiconductor device having thin film wiring layers according to the present invention.

FIG. 12 shows an essential part of a third embodiment of the semiconductor device having thin film wiring layers according to the present invention. In FIG. 12, a semiconductor device comprises a silicon (Si) substrate 46, a SiO₂ oxide layer 47 formed on the Si substrate 46, a contact hole 47a in the SiO₂ oxide layer 47, first and second wiring layers 48 made of aluminum containing carbon, a metal layer 49 provided between the first and second wiring layers 48, and a diffusion layer 50 under the contact hole 47a. The first wiring layer 48 formed directly on the SiO₂ oxide layer 47 is in contact with the diffusion layer 50 through the contact hole 47a. The first wiring layer 48 also contains silicon (Si) so as to prevent the silicon in the Si substrate 46 from diffusing into the first wiring layer 48 which is made primarily of aluminum. For example, when the metal layer 49 is made of aluminum containing carbon, the atomic percent of carbon contained in the first wiring layer 48 is made large compared to that of the metal layer 49.

Figure 13:
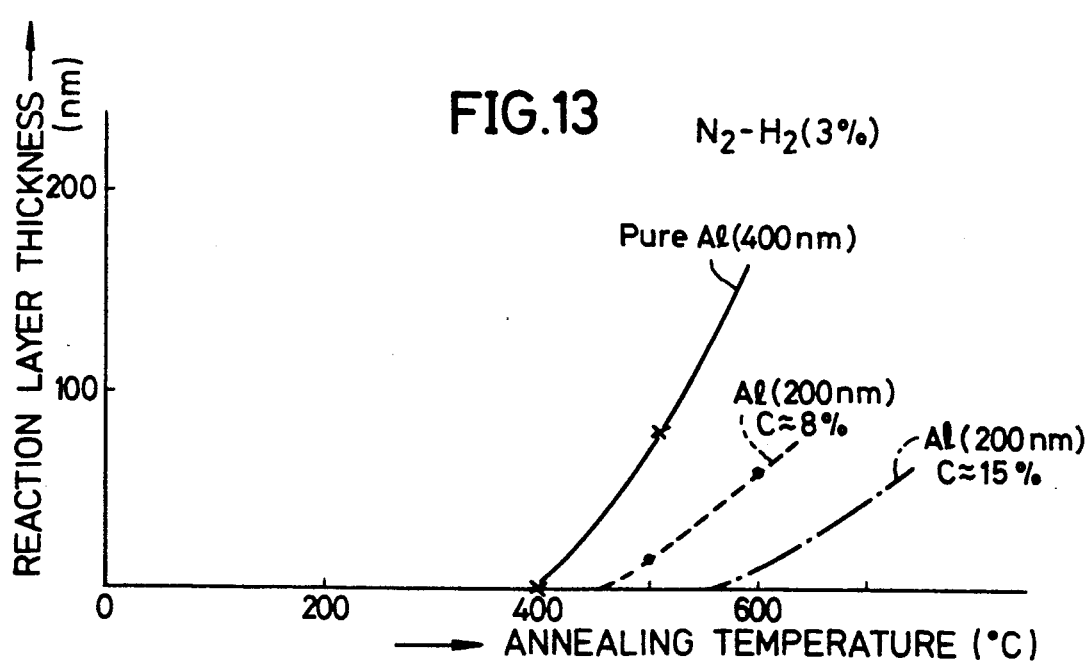
FIG. 13 shows an annealing temperature versus reaction layer thickness characteristic.

FIG. 13 shows an annealing temperature versus reaction layer thickness characteristic When a film made of pure aluminum is formed on a Si layer, for example, and is then subjected to an annealing process (30 min), a reaction layer is formed on the Si layer at annealing temperatures over approximately 400° C. as shown in FIG. 13. However, when a film made of aluminum containing carbon is formed on the Si layer and then subjected to the annealing process (30 min), the reaction layer is only formed at annealing temperatures of approximately 500° C. or over as shown in FIG. 13. Accordingly, when the first wiring layer 48 made of aluminum containing carbon contains an atomic percent of carbon greater than that contained in the second wiring layer 48, it is possible to prevent the formation of the reaction layer on the diffusion layer 50 and also minimize the resistivity of the first and second wiring layers 48 as a whole, in addition to the effects obtainable in the first embodiment described before. In the present embodiment, it is of course possible to provide more than two wiring layers as in the case of the second embodiment shown in FIG. 11.

Figure 14A:
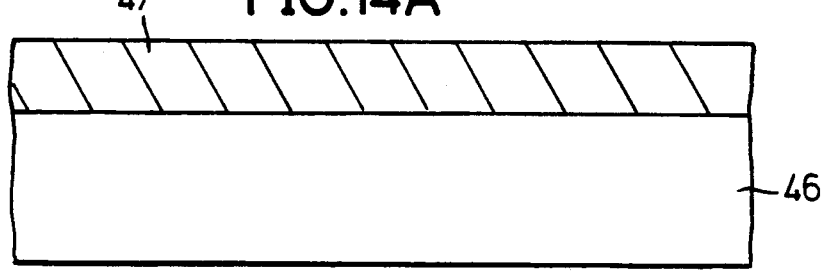
FIGS. 14A through 14C are cross sectional views for explaining the method of forming the thin films of the third embodiment shown in FIG. 12.
Figure 14B:
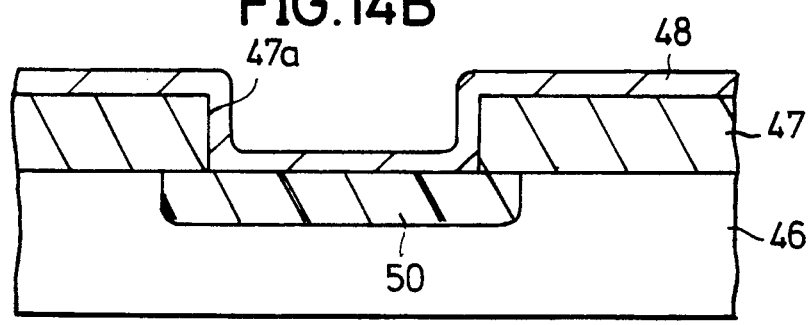
Figure 14C:
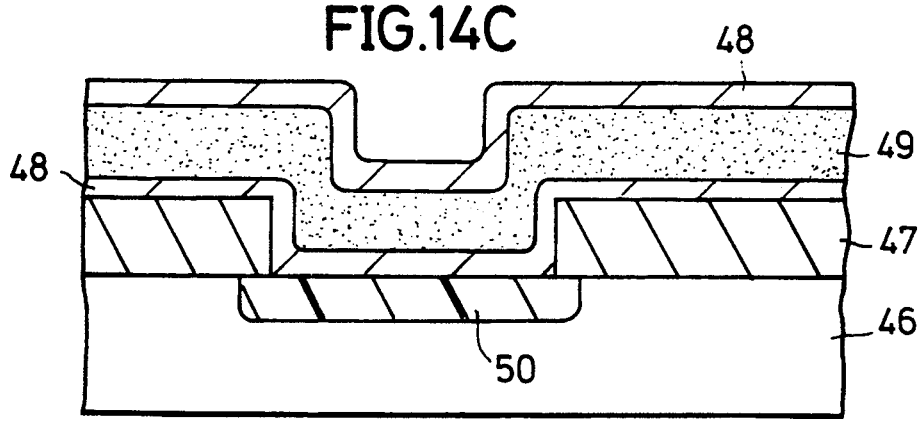

Next, a description will be given on the method of forming the thin film wiring layers in the semiconductor device shown in FIG. 12, by referring to FIGS. 14A through 14C. In FIGS. 14A through 14C, those parts which are the same as those corresponding parts in FIG. 12 are designated by the same reference numerals, and a description thereof will be omitted.

Firstly, in FIG. 14A, the SiO$_2$ oxide layer 47 is formed on the Si substrate 46 to a film thickness of 7000Å, by a thermal oxidation or CVD.

Secondly, in FIG. 14B, the contact hole 47a is formed in the SiO$_2$ oxide layer 47 by a known patterning process, and impurities are implanted into the Si substrate 46 through the contact hole 47a and activated so as to form the diffusion layer 50. In addition, the first wiring layer 48 is formed on the SiO$_2$ oxide layer 47 by a plasma CVD to a thickness of 2000Å, where the first wiring layer 48 is made of aluminum containing 15 atomic percent of carbon in a state where the carbon is chemically bonded to the aluminum. The plasma CVD is carried out by a parallel plate type plasma CVD system at a gas pressure of 2.3 Torr in an RF plasma of 13.56 MHz, so as to deposit aluminum by introducing a gas mixture of TMA gas and dilute hydrogen into the plasma. It is necessary to keep the substrate temperature relatively low within a range of 50° C. to 100° C. in order to keep the grain size small.

It is desirable that the first wiring layer 48 making direct contact with the diffusion layer 50 (that is, the Si substrate 46) additionally contains 1 to 2 atomic percent of silicon so as to prevent the silicon in the Si substrate 46 from diffusing into the first wiring layer 48 which is made primarily of aluminum. The silicon may be introduced into the first wiring layer 48 by carrying out the plasma CVD with a gas mixture of TMA gas, hydrogen gas and silane (SiH$_4$) gas.

Thirdly, the metal layer 49 is formed on the first wiring layer 48 to a film thickness of 6000Å by a CVD or sputtering, and the second wiring layer 48 is formed on the metal layer 49 to a thickness of 2000 Å similarly as in the case of the first wiring layer. It is not essential that the second wiring layer 48 contains silicon in addition to carbon.

The first embodiment of the method of forming thin film wiring layer according to the present invention described before especially with reference to FIG. 4 employs the plasma CVD. However, the plasma CVD requires a large RF power in order to obtain the high gas pressure that would result in the decomposition. However, when a large RF power is used, the silicon wafer is easily damaged Therefore, it is difficult to stably control the film thickness of the film which is formed by the plasma CVD.

Figure 15A:
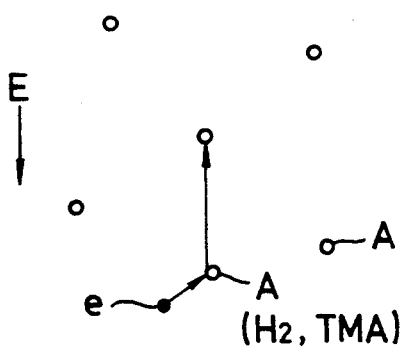
FIGS. 15A and 15B are diagrams for explaining electron motion in the plasma.
Figure 15B:
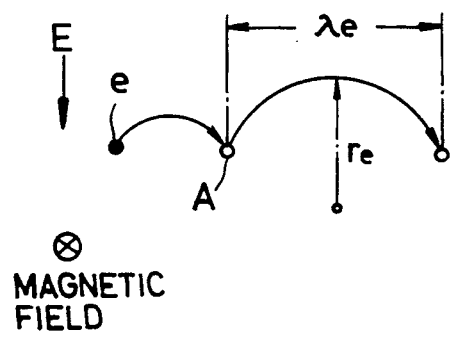

FIGS. 15A and 15B are diagrams for explaining electron motion in the plasma, where FIG. 15A shows the electron motion for the case where no magnetic field is applied and FIG. 15B shows the electron motion for the case where a magnetic field is applied. In the case shown in FIG. 15A, an electron e in the plasma moves in a direction opposite to that of an electric field E while colliding with particles A.

On the other hand, in the case shown in FIG. 15B, the electron e undergoes a circular motion described by an equation re=3.4×($\sqrt{V}$/B) (cm), where re denotes the Larmor radius (cm), V denotes the electron energy (eV) and B denotes the magnetic field intensity (Gauss). Hence, a traveling distance (mean free path) $\lambda e$ of the electron e becomes long, and the electron e undergoes more collisions with the particles A. As a result, there is more excitation of the gas particles, and the plasma reaction is enhanced.

According to the conventional etching, the gas pressure is in the order of $10^{-2}$ Torr and low. For this reason, the condition $\lambda e >>$ re is satisfied, and no peculiar dependencies exist among the gas pressure, the power and the source (carrier) gas quantity.

But the present inventors have found that in the case of the MPCVD, the gas pressure is in a range of 0.5 Torr to 5 Torr and is relatively high compared to the above described value of $10^{-2}$ Torr, and that because of this relatively high gas pressure, it is possible to stably control the film thickness of the film which is formed by the MPCVD when a predetermined condition is satisfied among the gas pressure, the RF power and the magnetic field intensity.

Figure 16:
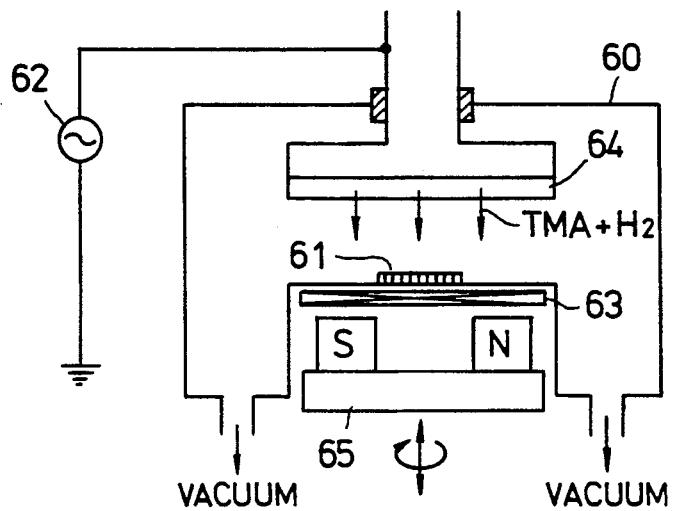
FIG. 16 generally shows a magnetron plasma chemical vapor deposition (MPCVD) system used in a second embodiment of the method of forming the thin film wiring layer according to the present invention.

Accordingly, a description will now be given with respect to the second embodiment of the method of forming thin film wiring layer according to the present invention employing the MPCVD. FIG. 16 generally shows an MPCVD system used in this second embodiment of the method. As shown in FIG. 16, a silicon (Si) wafer 61 is placed within a parallel plate type plasma chamber 60. An RF generator 62 generates a signal of 13.56 MHz, and a heater 63 is provided outside the chamber 60 at a position below the silicon wafer 61. A magnet 65 is located outside the chamber 60 below the heater 63. An organic metal gas such as trimethyl aluminum (Al(CH$_3$)$_3$, TMA) gas is diluted by hydrogen gas and introduced into the chamber 60 through shower nozzles 64 of the upper electrode In this case, the TMA gas is cooled to a temperature below the fusing point of 15° C., that is, to 5° C., for example.

Figure 17:
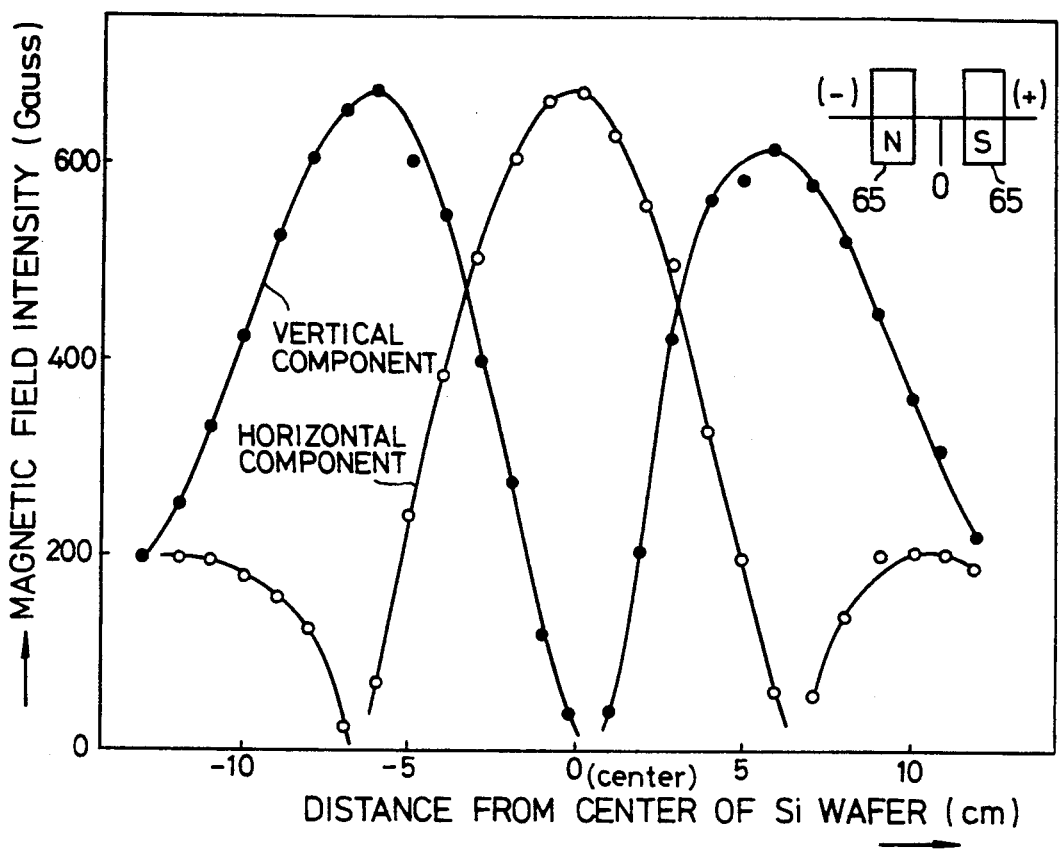
FIG. 17 shows a magnetic field intensity distribution on a silicon wafer.
Figure 18A:
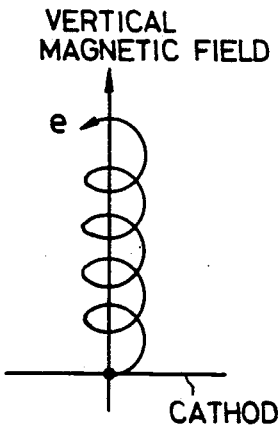
FIGS. 18A and 18B are diagrams showing the kinds of electron motion.
Figure 18B:
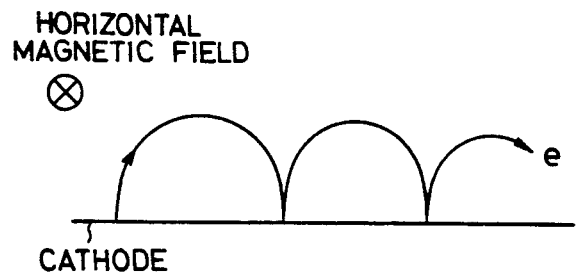

FIG. 17 shows a magnetic field intensity distribution on the Si wafer 61, separately for the horizontal component and the vertical component. The horizontal component is taken along a direction parallel to the top surface of the Si wafer 61, and the vertical direction is taken along a direction perpendicular to the top surface of the Si wafer 61. The motion of the electron e in the plasma due to the magnetic field can roughly be divided into a helical motion shown in FIG. 18A and a cycloidal motion shown in FIG. 18B. The helical motion is caused by the vertical magnetic field component, while the cycloidal motion is caused by the horizontal magnetic field component when the electron bent by the horizontal magnetic field component is reflected by the cathode and drifts by itself. In the case of the magnetic field which is applied so that the magnetic lines of force do not penetrate the Si wafer 61 as will be described later in conjunction with FIG. 22, the magnetic field intensity distribution becomes as shown in FIG. 17, and thus, there is mainly cycloidal motion at the central portion of the Si wafer 61 and there is mainly helical motion in portions on the right and left of the central portion of the Si wafer 61.

Figure 19:
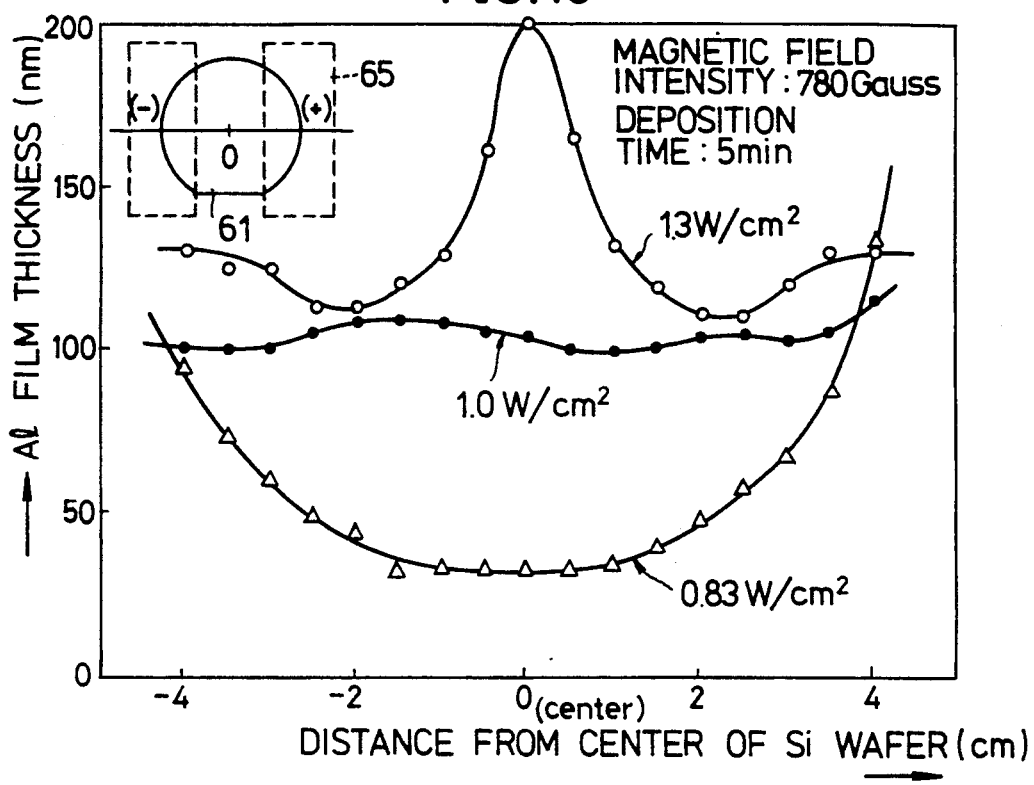
FIG. 19 shows an aluminum film thickness distribution on a silicon wafer.

FIG. 19 shows an aluminum film thickness distribution on the Si wafer 61. As may be seen from FIG. 19, the deposition rate at the central portion of the Si wafer 61 decreases as the RF power density decreases, because the radius of the cycloidal motion of electron increases due to the decrease in the RF power density and there is essentially no effect of the magnetic field.

At an RF power density of 1.0 W/cm$^2$, the effects of the cycloidal motion and the helical motion of electrons on the deposition become approximately the same, and it is possible to form a film having a uniform film thickness. Furthermore, when the RF power density is increased to 1.3 W/cm$^2$, for example, there is mainly cycloidal motion of the electrons, and the plasma reaction is enhanced at the central portion of the Si wafer 61 thereby increasing the deposition rate only at the central portion of the Si wafer 61. As a result, the RF power density must be set within a predetermined range in order to form a film having a uniform thickness.

Figure 20:
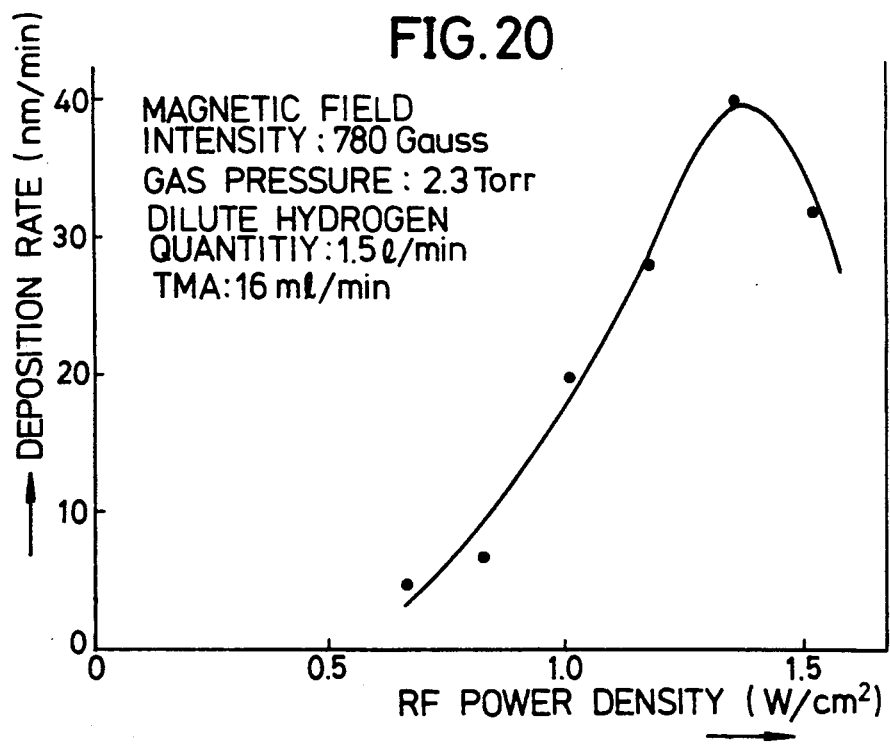
FIG. 20 shows an RF power density versus deposition rate characteristic.

FIG. 20 shows an RF power density versus deposition rate characteristic. The decrease in the deposition rate in the high RF power density region is peculiar to the present embodiment in which the magnetic field is applied to magnetically enhance the plasma reaction In a most desirable embodiment, the RF power density is set within a range of 0.5 W/cm$^2$ to 2.0 W/cm$^2$, and an optimum range for the deposition of an aluminum film by use of TMA gas is 1.0 W/cm$^2$ to 1.5 W/cm$^2$.

Figure 21:
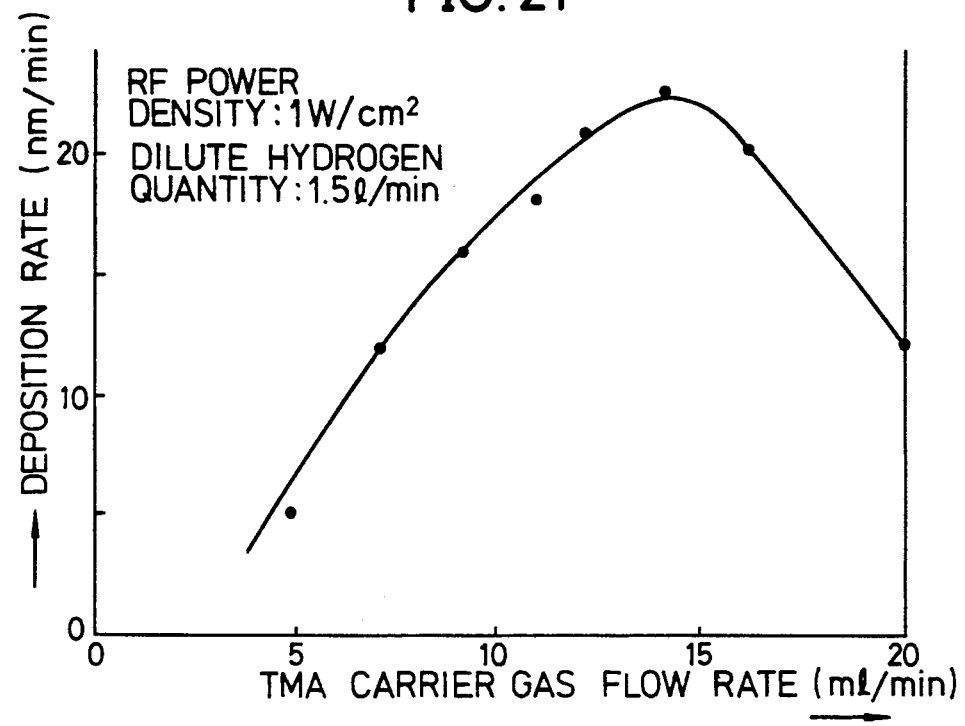
FIG. 21 shows a trimethyl aluminum (TMA) carrier gas flow rate versus deposition rate characteristic.

FIG. 21 shows a TMA carrier gas flow rate versus deposition rate characteristic. This characteristic shown in FIG. 21 is obtained when the TMA gas is used as the source gas, dilute hydrogen quantity is 1.5 l/min, RF power density is 1 W/cm$^2$, the magnetic field intensity is 780 Gauss and the gas pressure is 2.3 Torr. It may be regarded that the deposition rate decreases at the central portion of the Si wafer 61 for TMA carrier gas flow rate of 15 ml/min or more, because the mean free path of the electrons undergoing the cycloidal motion decreases due to the large molecules of the TMA and the excitation of the TMA gas is insufficient. In other words, in order to draw out the desired effects of the applied magnetic field, the RF power density or the magnetic field intensity must be increased so that the mean free path λe and the Raman radius re become approximately the same.

Figure 22:
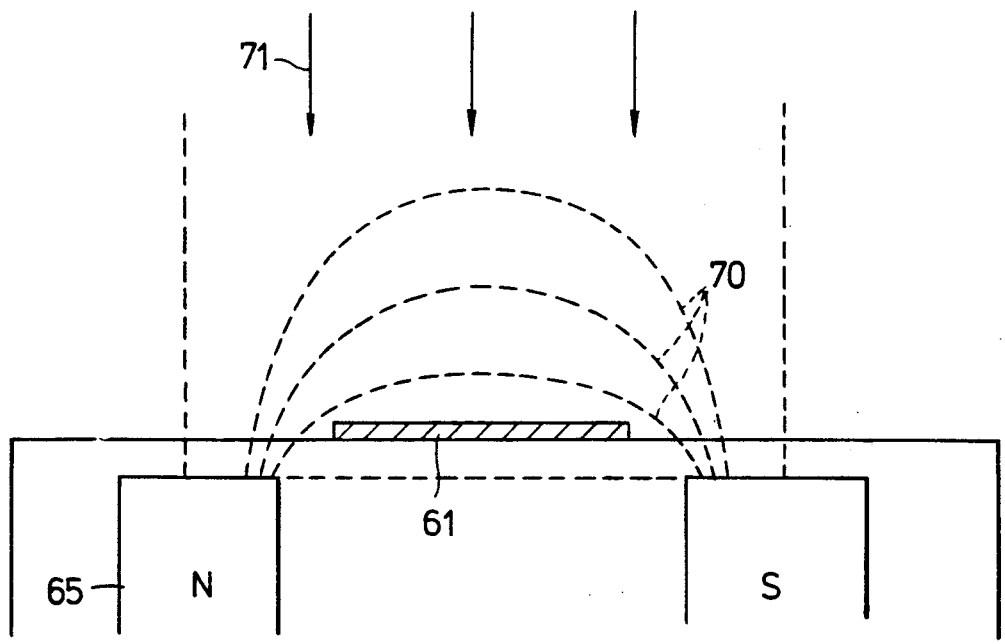
FIG. 22 shows magnetic lines of force generated by a magnetic field applied over the silicon wafer.

FIG. 22 shows magnetic lines of force generated by a magnetic field applied over the Si wafer 61, and the so-called planar magnetron is used to apply the magnetic field. As shown in FIG. 22, the TMA gas is introduced into a magnetic field indicated by magnetic lines of force 70, along the vertical direction as indicated by arrows 71, and the magnetic lines of force 70 do not penetrate the Si wafer 61 but are distributed above the Si wafer 61 in a loop. In addition, it is important that the magnetic field intensity is weaker toward the shower nozzles (not shown) through which the TMA gas is introduced. By taking these measures, the deposition occurs on the surface of the Si wafer 61 due to the TMA gas which is excited solely by the cycloidal motion of electrons in the vicinity of the surface of the Si wafer 61. In other words, the plasma chemical reaction is confined locally on the surface of the Si wafer 61 by the applied magnetic field. In this case, since the deposition takes place mainly in the vicinity of the surface of the Si wafer 61, it is possible to satisfactorily form a stepped portion of the wiring layer. On the other hand, since the magnetic field intensity is weaker toward the shower nozzles, it is possible to delicately excite the TMA gas by the cycloidal motion of electrons in a first stage and then enhance the reaction in a latter stage.

Figure 23:
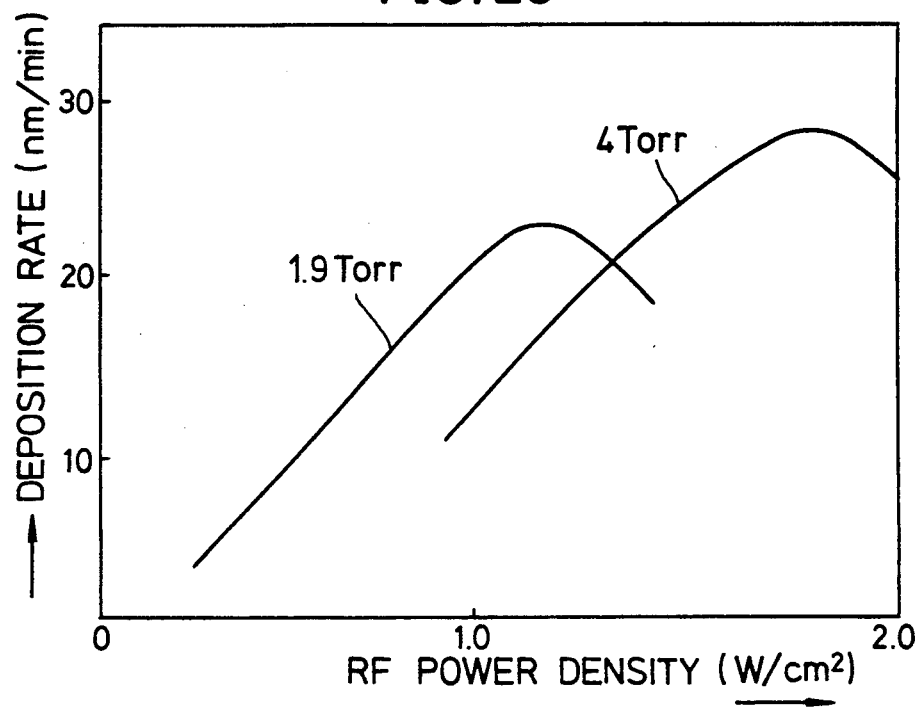
FIG. 23 shows an RF power density versus deposition rate characteristic.

FIG. 23 shows an RF power density versus deposition rate characteristic. Because the mean free path of electrons decreases when the gas pressure is increased, it is impossible to enhance the decomposition of the gas unless the magnetic field intensity and the RF power density are respectively set to high values. As may be seen from FIG. 23, in the case where the magnetic field intensity is constant, the RF power density must be increased by an amount corresponding to an amount of increase of the gas pressure.

Figure 24:
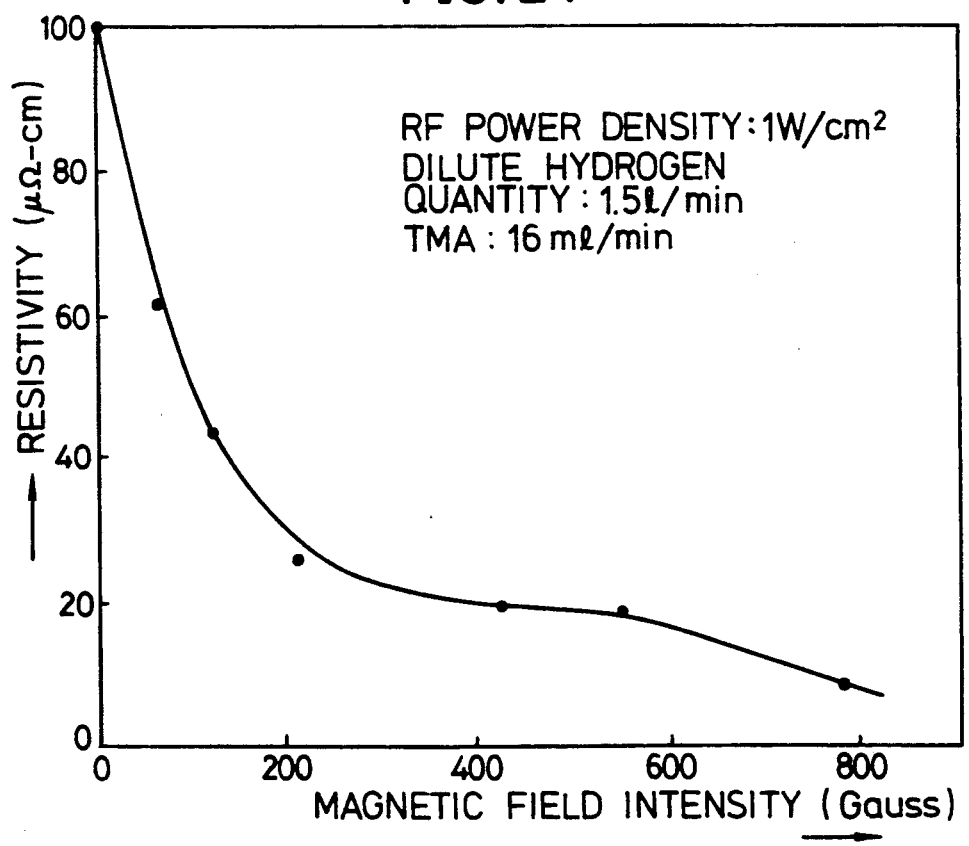
FIG. 24 shows a magnetic field intensity versus resistivity characteristic.

Therefore, it is seen that the magnetic field intensity or the RF power density must be set to a value greater than a predetermined value depending on the gas pressure, since the gas molecules must be excited to an energy level greater than or equal to an activation energy level at which the film deposition occurs. In other words, it is necessary to set a value P determined by (magnetic field intensity)×(RF power density)/(gas pressure) to a value which is proportional to the activation energy level at which the deposition occurs and is within a predetermined range. Concretely speaking, it is desirable that the magnetic field intensity is in a range of 200 Gauss to 1500 Gauss, the RF power density is in a range of 0.5 W/cm$^2$ to 2.0 W/cm$^2$ and the gas pressure is in a range of 1 Torr to 5 Torr, and in this case, the above described value P determined from the magnetic field intensity, the RF power density and the gas pressure falls in a range of 20 Gauss·W/cm$^2$·Torr to 3000 Gauss·W/cm$^2$·Torr. FIG. 24 shows a magnetic field intensity versus resistivity characteristic, and as may be seen from FIG. 24, the resistivity is small and is in the order of 20 $\mu\Omega$-cm when the magnetic field intensity is set to a value over 200 Gauss.

Therefore, according to the present embodiment of the method, it is possible to stably control the film thickness of the wiring layer which is formed by the MPCVD, and form an extremely thin wiring layer having a uniform film thickness.

Next, a description will be given on the X-ray diffraction angle versus X-ray intensity characteristics of aluminum films containing carbon formed by the plasma CVD and the MPCVD, respectively, after an annealing process is carried out. FIGS. 25A and 25B show the X-ray diffraction angle versus X-ray intensity characteristics of aluminum films containing carbon formed by the plasma CVD and the MPCVD, respectively, after an annealing process is carried out at 500° C. for 25 minutes. The intensity of the magnetic field applied in the MPCVD is set to 780 Gauss for the case shown in FIG. 25B, but the magnetic field intensity may be set to an arbitrary value over 200 Gauss.

It is seen from FIG. 25A that the grains of the aluminum film containing carbon formed by the plasma CVD are oriented generally on the (111) plane, while it is seen from FIG. 25B that the grains of the aluminum film containing carbon formed by the MPCVD are generally oriented on the (200) plane. The grain size of the aluminum film containing carbon formed by the MPCVD is 60 nm or less even after the annealing process is carried out, and is considerably small compared to that of the conventional aluminum film.

As described before, the resistivity of the aluminum film containing carbon formed by the MPCVD is small compared to that formed by the plasma CVD. In addition, the texture of the aluminum film containing carbon formed by the MPCVD is fine (dense) compared to that formed by the plasma CVD. As a result, the reliability of the aluminum film containing carbon formed by the MPCVD is high compared to that formed by the plasma CVD.

By comparing FIGS. 25A and 25B, it may be regarded that the above described advantages of the aluminum film containing carbon formed by the MPCVD over that formed by the plasma CVD are brought about by the grain orientation on the (200) plane, in addition to the fact that the aluminum film contains carbon.

Further, the present invention is not limited to these embodiments, but various variations and modifications may be made without departing from the scope of the present invention.

What is claimed is:

1. A semiconductor device comprising:

a first layer; and a second layer formed on said first layer, said second layer being a thin film wiring layer made of aluminum containing at least carbon, wherein the aluminum containing carbon has a grain size which is less than or equal to 100 nm in said second layer.

2. A semiconductor device as claimed in claim 1 in which said first layer is made of silicon and said second layer further contains silicon.

3. A semiconductor device as claimed in claim 2 in which said second layer contains 2 or less atomic percent of the silicon.

4. A semiconductor device as claimed in claim 1, further comprising:

a third layer made of a metal and formed on said second layer; and a fourth layer formed on said third layer, said fourth layer being a thin film made of aluminum containing carbon.

5. A semiconductor device as claimed in claim 4, wherein the metal of said third layer is selected from a group including tungsten and titanium.

6. A semiconductor device as claimed in claim 4, wherein said third layer is made of aluminum containing carbon, said third layer containing an atomic percent of carbon which is small compared to atomic percents of carbon contained in said second and fourth layers.

7. A semiconductor device as claimed in claim 4 in which said first layer is made of silicon and said second layer further contains silicon.

8. A semiconductor device as claimed in claim 4 in which said second layer contains an atomic percent of carbon greater than an atomic percent of carbon contained in said third layer.

9. A semiconductor device as claimed in claim 5 in which a plurality of pairs of said third layer type and said fourth layer type are provided on said fourth layer in alternate succession so that each third layer type is sandwiched between two fourth layer types.

10. A semiconductor device as claimed in claim 1, in which grains of said second layer are generally oriented on a (200) plane.

11. A semiconductor device as claimed in claim 1, in which said second layer contains 30 or less atomic percent of carbon in a state where carbon is chemically bonded to aluminum.

* * * * *